United States Patent
Onishi et al.

(10) Patent No.: US 7,781,339 B2
(45) Date of Patent: Aug. 24, 2010

(54) METHOD OF FABRICATING SEMICONDUCTOR INTERCONNECTIONS

(75) Inventors: Takashi Onishi, Kobe (JP); Mikako Takeda, Kobe (JP); Masao Mizuno, Kobe (JP); Susumu Tsukimoto, Kyoto (JP); Tatsuya Kabe, Kyoto (JP); Toshifumi Morita, Kyoto (JP); Miki Moriyama, Kyoto (JP); Kazuhiro Ito, Kyoto (JP); Masanori Murakami, Kyoto (JP)

(73) Assignee: Kobe Steel, Ltd., Kobe-shi (JP)

( * ) Notice: Subject to any disclaimer, the term of this patent is extended or adjusted under 35 U.S.C. 154(b) by 492 days.

(21) Appl. No.: 11/765,006

(22) Filed: Jun. 19, 2007

(65) Prior Publication Data

US 2008/0014743 A1    Jan. 17, 2008

(30) Foreign Application Priority Data

Jul. 12, 2006    (JP)    ................. 2006-192153

(51) Int. Cl.
    *H01L 21/44*    (2006.01)
    *H01L 21/4763*    (2006.01)
(52) U.S. Cl. .................... 438/687; 438/622; 438/623; 438/624
(58) Field of Classification Search ................. 438/622, 438/623, 624, 687
    See application file for complete search history.

(56) References Cited

U.S. PATENT DOCUMENTS

| 6,498,098 | B1 * | 12/2002 | Abe ........................... 438/687 |
| 2004/0180532 | A1 * | 9/2004 | Shue et al. .................. 438/626 |
| 2005/0255700 | A1 * | 11/2005 | Gopalraja et al. ........... 438/687 |
| 2006/0113674 | A1 * | 6/2006 | Toyoda et al. ............... 257/762 |

FOREIGN PATENT DOCUMENTS

JP    2001-7050    1/2001

OTHER PUBLICATIONS

U.S. Appl. No. 11/532,796, filed Sep. 18, 2006, Onishi, et al.

* cited by examiner

*Primary Examiner*—Matthew C Landau
*Assistant Examiner*—James M Mitchell
(74) *Attorney, Agent, or Firm*—Oblon, Spivak, McClelland, Maier & Neustadt, L.L.P.

(57) ABSTRACT

A method of fabricating semiconductor interconnections is provided which can form a Ti-rich layer as a barrier layer and which can embed pure Cu material as interconnection material into every corner of grooves provided in an insulating film even when the grooves have a narrow minimum width and are deep. The method may include the steps of forming one or more grooves in an insulating film on a semiconductor substrate, the recess having a minimum width of 0.15 μm or less and a ratio of a depth of the groove to the minimum width thereof (depth/minimum width) of 1 or more, forming a Cu alloy thin film containing 0.5 to 10 atomic % of Ti in the groove of the insulated film along a shape of the groove in a thickness of 10 to 50 nm, forming a pure Cu thin film in the groove with the Cu alloy thin film attached thereto, and annealing the substrate with the films at 350° C. or more to allow the Ti to be precipitated between the insulating film and the Cu alloy thin film.

13 Claims, 2 Drawing Sheets

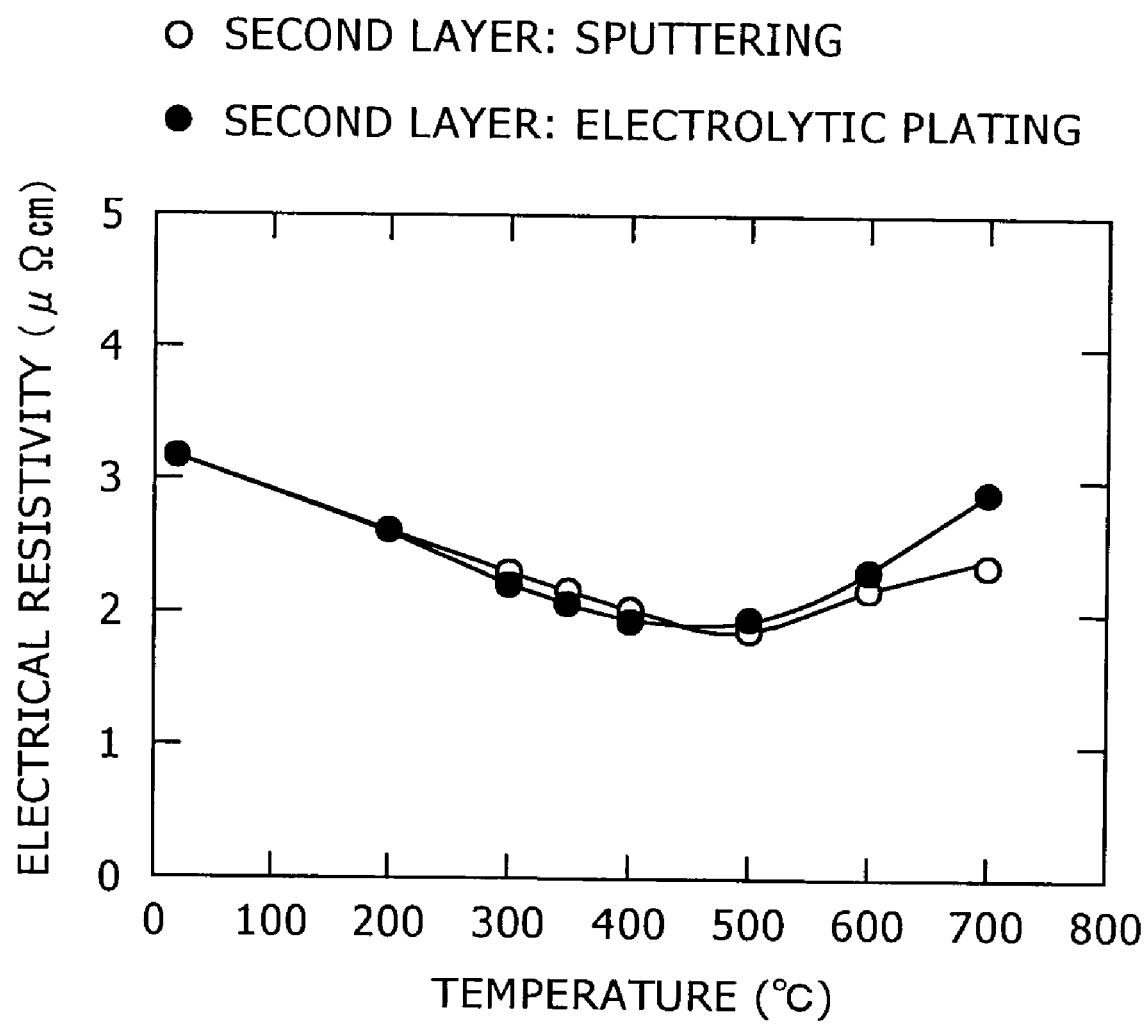

METHOD OF FABRICATING SEMICONDUCTOR INTERCONNECTIONS

BACKGROUND OF THE INVENTION

1. Field of the Invention

The present invention relates to semiconductor devices, and more specifically, to a method of fabricating interconnections in a semiconductor device, such as a Si semiconductor device, for example, typified by an ultra-large scale integrated circuit (ULSL).

2. Description of the Related Art

The design rule of semiconductor devices such as large-scale integrated circuits (LSIs) has become much stricter so as to satisfy requirements for larger packing densities and higher-speed signal transmission of the LSI. The interconnection pitch, width and interval between interconnections, and an interlayer contact hole (via) for connecting the interconnections, for example, have been reduced in size.

For larger packing densities of semiconductor devices, a multilayer interconnection structure has been studied. And, the ratio of the depth of an interconnection groove (trench) to the width of the groove (depth/width of the interconnection groove), or the ratio of the depth of an interlayer contact hole for connecting the interconnections to the diameter of the hole (depth/width of the contact hole) has been increased.

Furthermore, the resistance of the interconnections is increased together with miniaturization and increase in packing density of an interconnection circuit, which causes delay of the signal transmission. Thus, the formation of Cu-based interconnections has been proposed in which an interconnection material based on Cu (hereinafter referred to as a Cu-based interconnection material) is used as an interconnection material that can have a lower electric resistance than that of conventional interconnection material based on Al (hereinafter referred to as an Al-based interconnection material).

A damascene interconnection technique has been known as a method for forming Cu-based interconnections having a multilayer structure (as disclosed in, for example, Japanese Patent Application Laid-Open (JP-A) No. 2001-7050). In the damascene technique, for example, interconnection grooves or interlayer contact holes (hereinafter collectively referred to as recesses) are formed in an interlayer insulating film provided on a semiconductor substrate. Then, the Cu-based interconnection material, such as pure Cu or Cu alloy, is applied to the surface of the recess, which is heated and pressed to fluidize the Cu-based interconnection material. The Cu-based material is embedded into the recesses thereby to form Cu-based interconnections. The excessive Cu-based interconnection material is removed by chemical mechanical polishing (CMP).

In use of the Cu-based interconnection material, when the interlayer insulating film is directly brought into contact with the Cu-based interconnections, Cu may be diffused into the insulating film, which degrades insulation property of the insulating film. In order to prevent diffusion of the Cu into the interlayer insulating film, it is necessary to provide a barrier layer between the insulating film and the Cu-based interconnections. The barrier layer is required to exhibit barrier properties even when heated at high temperatures of about 500 to 700° C. so as to embed the Cu-based interconnections into the recesses. For this reason, the barrier layer is formed by using a metal nitride film, such as a TaN film or a TiN film. Such a barrier layer, however, has a high electrical resistivity as compared to that of a metal film, which disadvantageously increases the electrical resistivity of the interconnections.

Moreover, it is difficult to uniformly form a thin barrier layer so as to decrease the electrical resistivity of the interconnections. Additionally, in recent years, the width of the interconnection groove or the diameter of the contact hole has become increasingly smaller as mentioned above. The depth/width ratio of the interconnection groove or the depth/diameter ratio of the contact hole has become increasingly larger. This makes it more difficult to form the barrier layer.

Thus, the present inventors have paid attention to vapor quenching in a sputtering method so as to uniformly form an extremely thin barrier film between the Cu-based interconnections and the interlayer insulating film, and have proposed that a Ti-rich layer is formed as the extremely thin barrier film using a non-equilibrium solid solution phenomenon, (see "Self-Formation of Barrier Material by Cu Alloy Interconnections" Proceedings of 10th Workshop on Stress Induced Phenomena in Metallization, p28-29 (2004)). In this technique as disclosed in the above-mentioned document, the Cu alloy containing Ti, which has a small solubility limit with respect to Cu, is formed in the interconnection groove, or on the surface of the contact hole, and then heated and pressed to be separated into two phases, namely, Cu and Ti. Then, Ti is abnormally diffused into between the Cu-based interconnections and the interlayer insulating film, or on the surface of the Cu-based interconnections to form a Ti-rich layer. In particular, the Ti-rich layer formed between the Cu-based interconnections and the interlayer insulating film serves as a barrier layer for preventing the diffusion of Cu into the insulating film. When the insulating film is made of oxide-based material, such as $SiO_2$ based material, the diffused Ti forms $TiO_x$. As the thickness of the TiOx layer becomes large to some degree, the reaction between Ti and oxygen is stopped. This can prevent the Ti-rich layer from being excessively thick, thus reducing an increase in electrical resistivity of the Cu-based interconnections.

The Cu—Ti alloy, however, has bad flow properties (hereinafter referred to as reflowability) even when heated at high temperature, as compared to that of the pure Cu, and thus is difficult to be embedded into every corner of the recesses. In recent years, the width of the interconnection groove or the diameter of the contact hole has become increasingly small, and the depth of the interconnection groove or the contact hole has become increasingly large as mentioned above. This makes it more difficult to embed the Cu—Ti alloy into the recesses.

SUMMARY OF THE INVENTION

The invention has been made in view of the foregoing circumstances, and it is therefore an object of the invention to provide a method of fabricating semiconductor interconnections which can form a Ti-rich layer as a barrier layer and which can embed pure Cu material as interconnection material into every corner of recesses provided in an insulating film even when the recesses have a narrow minimum width and are deep.

The inventors have been dedicated themselves to studying a method which can form a barrier layer along the shape of recesses provided in an insulating film and which can embed interconnection material into every corner of the recesses even when the recesses have a narrow minimum width and are deep. As a result, the inventors have found that a Cu—Ti alloy film is formed very thinly on the surface of each recess using a Cu alloy containing Ti as a barrier layer forming material, so that a barrier layer can be formed by the following heating process even when the recesses have a narrow minimum width and are deep. In addition, the use of pure Cu as the interconnection material can embed the pure Cu into every corner of the recesses even when the recesses have the narrow minimum width and are deep.

A method of fabricating semiconductor interconnections according to the aspect of the invention which can solve the above-mentioned problems includes the steps of forming one or more grooves in an insulating film on a semiconductor substrate, the recess having a minimum width of 0.15 μm or less, and a ratio of a depth of the groove to the minimum width thereof (depth/minimum width) of 1 or more, and forming a Cu alloy thin film containing 0.5 to 10 atomic % of Ti in the groove of the insulated film along the shape of the groove in a thickness of 10 to 50 nm. The method also includes the steps of forming a pure Cu thin film in the groove with the Cu alloy thin film attached thereto, and annealing the substrate with the films at 350° C. or more to allow the Ti to be precipitated between the insulating film and the Cu alloy thin film. The Cu alloy thin film may be deposited, for example, by sputtering. When the pure Cu thin film is deposited by the sputtering, the pure Cu thin film may preferably be pressed into the groove with the Cu alloy thin film attached thereto. The pressing is performed, for example, at 50 MPa or more.

According to the aspect, the Cu alloy containing Ti is used as a barrier layer forming material, and the Cu—Ti alloy film is formed extremely thinly so as to be embedded into the recesses. Thus, the alloy thin film containing Ti can be formed along the recess, so that the Ti-rich layer can be formed even when the recesses have the narrow minimum width and are deep. Since the pure Cu is used as the interconnection material, the interconnection material can be easily embedded into the recess provided in the insulating film even when the recesses have the narrow minimum width and are deep.

BRIEF DESCRIPTION OF THE DRAWINGS

FIG. 2 is a diagram showing a relationship between a heating temperature and an electrical resistivity in Experimental Example 6.

DETAILED DESCRIPTION OF THE PREFERRED EMBODIMENTS

Figure 1A:
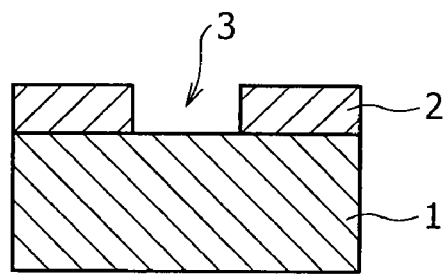
FIG. 1 is a diagram for explaining an outline of a method of fabricating semiconductor interconnections according to the invention.
Figure 1B:
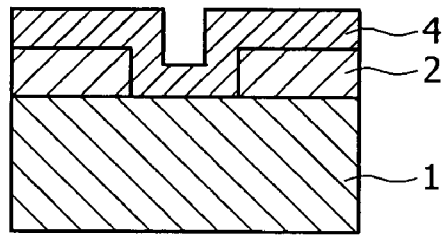
Figure 1C:
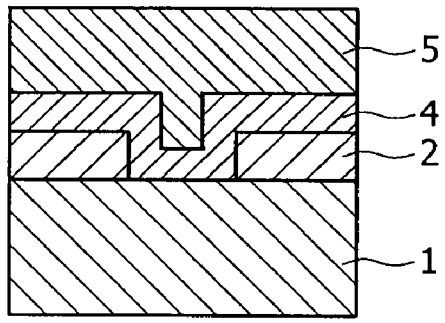
Figure 1D:
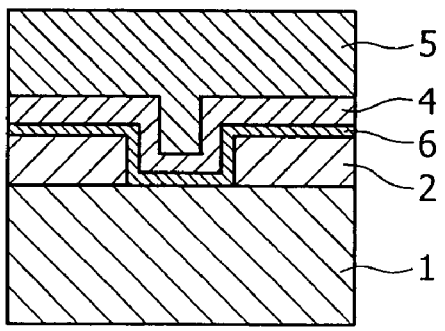

An outline of a method of fabricating semiconductor interconnections according to the invention will now be described using FIG. 1. In forming the semiconductor interconnections of the invention, recesses 3 are formed in an insulating film 2 on a semiconductor substrate 1 (see FIG. 1A), and then a Cu alloy thin film 4 containing Ti is formed along the shape of the recesses in the recesses 3 of the insulating film 2, for example, by sputtering (see FIG. 1B). Thereafter, a pure Cu thin film 5 is formed in the recesses with the Cu alloy thin film 4 attached thereto, for example, by electrolytic plating (see FIG. 1C), and then heated, so that semiconductor interconnections can be formed (see FIG. 1D). In the invention, Ti contained in the Cu alloy thin film 4 is diffused and concentrated into between the Cu alloy thin film 4 and the insulating film 2 in heating to form a Ti-rich layer 6. The Ti-rich layer 6 serves as a barrier layer for preventing the diffusion of Cu into the insulating film 2.

The above-mentioned Ti-rich layer 6 is formed of compounds which include Ti and elements constituting the insulating film 2. Thus, when the insulating film 2 is an oxide-based insulating film (for example, a $SiO_2$-based insulating film), the Ti-rich layer 6 is mainly composed of TiOx.

The thickness of the Ti-rich layer 6 produced in formation of the semiconductor interconnections is not limited particularly, but is preferably 1 nm or more so as to ensure the barrier properties, more preferably 2 nm or more, and further more preferably 3 nm or more. When the thickness of the Ti-rich layer 6 becomes excessively thick, the electrical resistivity of the Cu-based interconnections becomes high. For this reason, the thickness of the Ti-rich layer 6 may preferably be 17 nm or less, more preferably 16 nm or less, further more preferably 15 nm or less.

In order to form the Ti-rich layer 6 in heating in this way, it is very important that the Cu alloy thin film 4 containing 0.5 to 10 atomic % of Ti is formed as the barrier layer forming material along the shape of each recess in the insulating film. For Ti content below 0.5 atomic %, an amount of Ti to be concentrated in between the insulating film 2 and the Cu alloy thin film 4 is short, resulting in an extremely thin Ti-rich layer 6, which fails to ensure the barrier properties. Moreover, when the amount of concentration of Ti is short, the Ti-rich layer 6 is formed discontinuously, thus leading to reduction in barrier properties. Accordingly, the Ti contained in the Cu—Ti alloy is 0.5 atomic % or more, preferably 1 atomic % or more. In contrast, even when the Ti content is excessive, the thickness of the Ti-rich layer 6 formed between the insulating film 2 and the Cu alloy thin film 4 is limited to some degree. In this case, the excessive Ti not contributing to the formation of the Ti-rich layer 6 forms a solid solution in the Cu alloy thin film 4, or forms deposits in the Cu alloy thin film 4. This kind of solid solution Ti or Ti deposit may enhance the electrical resistivity of the Cu-based interconnections. Thus, the content of Ti is 10 atomic % or less, preferably 9 atomic % or less, more preferably 8 atomic % or less. Although a part of the Ti contained in the Cu alloy thin film 4 may also be diffused in between the Cu alloy thin film 4 and the pure Cu thin film 5, the above-mentioned range of Ti content does not enhance the electrical resistivity of the Cu-based interconnections.

In order to form the Cu alloy thin film along the shape of the recess, it is important to set the thickness of the above Cu alloy thin film 4 to 10 to 50 nm. This is because the thinning of the Cu alloy thin film 4 formed as the barrier layer forming material enables the formation of the Cu alloy thin film 4 along the shape of the recesses, without forming a bridge of the Cu alloy thin film so as to cover openings of the recesses even when the recesses disposed in the insulating film have a narrow minimum width and are deep. For the Cu alloy thin film having a thickness below 10 nm, heating cannot provide a Ti-rich layer 6 having a sufficient thickness, which leads to reduction of the barrier properties. Thus, the thickness of the Cu alloy thin film 4 is 10 nm or more, preferably 15 nm or more, more preferably 20 nm or more. When the thickness of the Cu alloy thin film 4 exceeds 50 nm, the Cu alloy thin film 4 is formed along the shape of the recesses of the insulating film 2 to some degree, while the excessive part of the Cu alloy thin film 4 causes a bridge so as to cover the openings of the recesses to form voids in the recesses, which degrades the performance of the Cu-based interconnections. Accordingly, the thickness of the Cu alloy thin film 4 is 50 nm or less, preferably 45 nm or less, more preferably 40 nm or less.

The term "thickness of the above Cu alloy thin film 4" as used herein means the minimum thickness of the film 4 when the thickness of the Cu alloy thin film 4 formed along the inside of the recess (a side wall or a bottom surface of the recess) is measured by observing a section of the film 4 taken so as to expose the shape of the recess of the insulating film 2. The Cu alloy thin film 4 is easily formed on the bottom surface of the recess, but is difficult to be formed on the side wall of the recess. The Cu alloy thin film 4 tends to be formed thinly on the side wall of the recess. The thickness of the Cu alloy thin film 4 can be measured, for example, by a method to be described in the following columns of examples.

A method for forming the Cu alloy thin film 4 along the shape of the recesses of the insulating film 2 is not limited particularly, but may be, for example, a sputtering method to be employed. The use of the sputtering method can form an extremely thin Cu alloy thin film 4 along the shape of the recess. The sputtering method may be, for example, a long slow sputtering method.

In order to form the Cu alloy thin film 4 containing Ti by the sputtering method, a Cu alloy target containing Ti, or a chip-on-target which includes a pure Cu target with Ti chips attached to one side of the target may be used as a sputtering target, and the sputtering may be performed under an inert gas atmosphere.

The inert gases for use in the sputtering may include, for example, helium, neon, argon, krypton, xenon, radon, and the like. Preferably, argon, and xenon may be used. In particular, argon is relatively low-cost, and thus can be used suitably. Other sputtering conditions (for example, ultimate pressure, sputtering gas pressure, discharge power density, substrate temperature, distance between electrodes, and the like) are not limited particularly, but may be adjusted within the usual ranges.

After forming the Cu alloy thin film 4 containing Ti along the shape of the recesses of the insulating film 2, the pure Cu thin film 5 is formed as the interconnection material in the recesses with the Cu alloy thin film 4 attached thereto. The use of the pure Cu thin film 5 as the interconnection material can embed the pure Cu into every corner of the recesses with the Cu alloy thin film 4 attached thereto even when the recesses have a narrow minimum width and are deep.

The thickness of the pure Cu thin film 5 provided in the recesses with the Cu alloy thin film 4 attached thereto may be changed according to the depth of the recess, and specifically, the pure Cu thin film 5 having the same thickness as the depth of at least the recess may be formed. The maximum thickness of the pure Cu thin film 5 is, for example, 2 μm. As the thickness of the pure Cu thin film 5 becomes extremely large, the strength of the pure Cu thin film will be high, and thus the pure Cu will be difficult to be embedded into the recess even by being pressing against the recess as described later.

A method for forming the above-mentioned pure Cu thin film 5 is not limited particularly, but may be, for example, electrolytic plating, chemical vapor deposition (CVD), (arc) ion plating, sputtering, or the like. In particular, the use of the electrolytic plating can fill the recesses with the pure Cu thin film 5 by gradually embedding the pure Cu thin film 5 into the recesses from the bottom side thereof. This can embed the pure Cu into every corner of the recesses even when the recesses have the narrow minimum width and are deep.

On the other hand, when the pure Cu thin film 5 is formed by the sputtering method, the pure Cu thin film 5 may be pressed into the recesses with the Cu alloy thin film 4 attached thereto. When the pure Cu thin film 5 is intended to be formed in the recesses with the Cu alloy thin film 4 attached thereto only by the sputtering method, the pure Cu thin film 5 may form a bridge so as to cover openings of the recesses, thus causing voids in the Cu-based interconnections. However, since the pure Cu has good reflowability, pressing of the pure Cu thin film 5 allows the pure Cu thin film 5 to be pressed and inserted into the recesses with the Cu alloy thin film 4 formed thereon.

When the pure Cu thin film 5 is formed by the sputtering method, a mixed gas consisting of the above-mentioned inert gas and $H_2$ gas may be used as sputtering gas so as to enhance the reflowability of the pure Cu thin film 5.

The condition for pressing the pure Cu thin film 5 is not limited particularly, but is, for example, 50 MPa or more in pressure, preferably 100 MPa or more, more preferably 150 MPa or more. Although the pressure is preferably as high as possible, the pressure exceeding 200 MPa is too high and unpractical, and thus the maximum pressure is about 200 MPa, preferably 150 MPa or less.

The pure Cu thin film 5 is formed in the recesses with the Cu alloy thin film 4 attached thereto, and then heated at a temperature of 350° C. or more. When the heating temperature is below 350° C., Ti is not diffused sufficiently into between the Cu alloy thin film 4 and the insulating film 2, resulting in high electrical resistivity of the Cu-based interconnections. Therefore, the heating temperature is 350° C. or more. The heating temperature is preferably as high as possible, preferably 400° C. or more, more preferably 450° C. or more, further more preferably 500° C. or more. The maximum heating temperature is about 700° C. A device for heating at a temperature above 700° C. is unpracticable, and when the heating temperature is extremely high, the electrical resistivity of the Cu-based interconnections tends to become larger. This may cause deformation of the semiconductor substrate. The maximum heating temperature is preferably 650° C., more preferably 600° C. The atmosphere in heating is not limited particularly, but may be preferably the above-mentioned inert gas atmosphere, for example.

As mentioned above, in the invention, the pure Cu is embedded as an interconnection material into the recesses of the insulating film 2. The recess has the minimum width of 0.15 μm or less, and the ratio of the depth of the recess to the minimum width there of (hereinafter referred to as a depth/minimum width) is 1 or more. This is because, when the minimum width of the interconnection groove or the minimum width (diameter) of the interlayer contact hole exceeds 0.15 μm, or when the depth is shallow and the depth/minimum width ratio is below 1, it is unnecessary to uniformly form the barrier layer thinly so as to lessen the electrical resistivity of the Cu-based interconnections. Accordingly, the invention may be applied to a case in which pure Cu is embedded as the interconnection material into recesses (interconnection grooves and/or interlayer contact holes) having the minimum width of 0.15 μm or less and the depth/minimum width ratio of 1 or more.

The materials of the insulating film 2 is not limited particularly, but may include, for example, silicon oxide, silicon nitride, BSG (Boro-Silicate Glass), PSG (Phospho-Silicate Glass), BPSG (Boro-Phospho-Silicate Glass), TEOS (SiOF), and the like.

EXAMPLES

The present invention will now be described in further detail with reference to the following examples which by no means limit the scope of the present invention. Any appropriate modifications can be made to these examples without deviating from the scope of the present invention as mentioned above and below, and are within the technical range of the present invention.

Experimental Example 1

A pure Cu thin film, or a Cu alloy thin film containing the amount shown in Table 1 of Ti was formed on an insulating film (TEOS film: SiOF film) formed on a silicon wafer surface of each sample by DC magnetron sputtering to have a thickness of 50 nm. Then, a pure Cu thin film was formed on the previously formed film by the DC magnetron sputtering to have a thickness of 700 nm.

The sputtering was performed using a pure Cu target or a chip-on target in a sputtering apparatus HSM-552 manufactured by Simadzu Corporation. The chip-on target used was one including three to six Ti 5 mm-square chips bonded to the surface of the pure Cu target (100 mmφ) serving as a base around erosion positions. The composition of the Cu alloy thin film was adjusted by changing the number of pieces and the bonded positions of the Ti chips.

The sputtering conditions were as follows: ultimate pressure of $133 \times 10^{-6}$ Pa or less ($1 \times 10^{-6}$ Torr or less), atmospheric gas in sputtering of Ar, sputtering gas pressure of $267 \times 10^{-3}$ Pa ($2 \times 10^{-3}$ Torr), discharge power density of 3.2 W/cm$^2$ (DC), substrate temperature set at room temperature (20° C.), and distance between electrodes of 55 mm.

The components (Ti and Cu) of the Cu alloy thin film formed by the sputtering were quantitatively assessed by inductively coupled plasma (ICP) emission spectroscopy using an ICP emission spectrophotometer ICP-8000 manufactured by Simadzu Corporation.

After this film forming step, the samples were subjected to a heating and pressing process. In the heating and pressing process, each sample was pressed at a pressure of 150 MPa under Ar gas atmosphere, heated from room temperature up to 500° C. at a rate of temperature increase of 20° C. per minute, held at 500° C. for 120 minutes, and then cooled up to the room temperature at a rate of temperature decrease of 20° C. per minute.

The section of the sample with a laminated state of the films rendered viewable after the heating and pressing process was observed by a transmission electron microscope (TEM) with fifty thousand fold magnification. As a result of observation, it was found that a Ti oxide layer was formed as a Ti-rich layer between the insulating film and the Cu alloy thin film. This Ti oxide layer was considered to be a TiO$_2$ layer from a thermaldynamic point of view. Only the thickness of the Ti oxide layer of each sample was measured, and the results of measurement were shown in the following Table 1.

The Ti oxide layer of each sample was observed along a length of 2000 nm in the longitudinal direction, and it was determined whether or not there was a broken part (defect) of the Ti oxide layer, whereby the completeness of the Ti oxide layer was evaluated. Evaluation criteria were as follows. That is, when the Ti oxide layer was not broken, this case was determined to be acceptable (O); and when a part of the Ti oxide layer was broken, this case was determined to be unacceptable (x). The results of this evaluation were shown in the following Table 1.

A part (interface) between the insulating film and the pure Cu thin film (or the Cu alloy thin film) of each sample was observed along a length of the interface of 200 nm, and it was determined whether or not Cu is diffused into the insulating film. The determination of diffusion of the Cu was performed by observing the part (interface) between the insulating film and the Cu interconnections by TEM, and by analyzing the presence or absence of the Cu by the EDS. Evaluation criteria were as follows. That is, when the Cu was not diffused into the insulating film, the barrier properties of the Ti oxide layer was determined to be good (acceptable: O), and when the Cu was diffused into the insulating film, the barrier properties of the Tioxide layer was determined to bad (unacceptable: x). Also, the results of this evaluation were shown in the following Table 1.

Table 1 clearly shows that the larger the amount of Ti contained in the Cu alloy thin film formed by the sputtering, the thicker the Ti oxide layer formed by the heating and pressing process. In particular, for the Cu alloy thin film containing 0.5 atomic percent or more of Ti, the thickness of the Ti oxide layer is about 1 nm or more. It is understood that the Ti oxide layer serves as a barrier layer for preventing diffusion of Cu into the insulating film.

TABLE 1

| No. | Ti content (Atomic %) | Thickness of Ti oxide layer (nm) | Completeness of Ti oxide layer | Barrier properties |
|---|---|---|---|---|
| 1 | 0 | — | — | X |
| 2 | 0.2 | 0.4 | X | X |
| 3 | 0.5 | 1.1 | O | O |
| 4 | 1.0 | 2.4 | O | O |
| 5 | 2.0 | 2.9 | O | O |
| 6 | 3.0 | 5.8 | O | O |
| 7 | 5.0 | 10.4 | O | O |
| 8 | 7.0 | 12.5 | O | O |
| 9 | 10.0 | 18.6 | O | O |
| 10 | 15.0 | 25.9 | O | O |

Experimental Example 2

A pure Cu thin film, or a Cu alloy thin film containing the amount shown in Table 2 of Ti was formed on an insulating film (TEOS film: SiOF film) formed on a silicon wafer surface of each sample by DC magnetron sputtering to have a thickness of 50 nm. Then, a pure Cu thin film was formed on the previously formed film by electrolytic plating to have a thickness of 700 nm.

The sputtering was performed under the same condition as that of Experimental Example 1. The electrolytic plating was performed by a constant-direct-current electrolysis method with the current density of 5 mA/cm$^2$ using as a plating bath "Microfab Cu-100: basic solution (brand name)" manufactured by Tanaka Kikinzoku Kogyo K.K. (which is an aqueous solution mainly consisting of copper sulfate and sulfuric acid, to which chlorine ions, a plating accelerator, a leveling agent, and a brightener are added).

The components (Ti and Cu) of the Cu alloy thin film formed by the sputtering were quantitatively assessed in the same way as that of Experimental Example 1.

After this film forming step, the samples were subjected to a heating process. In the heating process, each sample was heated from room temperature up to 500° C. at a rate of temperature increase of 20° C. per minute under Ar gas atmosphere, held at 500° C. for 120 minutes, and then cooled up to the room temperature at a rate of temperature decrease of 20° C. per minute.

The section of the sample with a laminated state of the films rendered viewable after the heating and pressing process was observed in the same way as that of the above-mentioned Experimental Example 1. As a result of observation, it was found that a Ti oxide layer was formed as a Ti-rich layer between the insulating film and the Cu alloy thin film. The Ti oxide layer was considered to be a TiO$_2$ layer from a thermaldynamic point of view. Only the thickness of the Ti oxide layer of each sample was measured, and the results of measurement were shown in the following Table 2.

The Ti-rich layer was observed in the same way as that of the above-mentioned Experimental Example 1, and it was determined whether or not there was a broken part (defect) of the Ti oxide layer, whereby the completeness of the Ti oxide layer was evaluated. The results of this evaluation were shown in the following Table 2.

A part (interface) between the insulating film and the pure Cu thin film (or the Cu alloy thin film) of each sample was observed in the same way as that of Experimental Example 1, and it was determined whether or not Cu is diffused into the insulating film. The results of this evaluation were shown in the following Table 2.

Table 2 clearly shows that the Ti-rich layer is formed only by heating, and that the larger the amount of Ti contained in the Cu alloy thin film formed by the sputtering, the thicker the Ti oxide layer formed by the heating process. In particular, for the Cu alloy thin film containing 0.5 atomic percent or more of Ti, the thickness of the Ti-rich layer is about 1 nm or more. It is understood that the Ti-rich layer serves as a barrier layer for preventing diffusion of Cu into the insulating film.

TABLE 2

| No. | Ti content (Atomic %) | Thickness of Ti oxide layer (nm) | Completeness of Ti oxide layer | Barrier properties |
|---|---|---|---|---|
| 11 | 0 | — | — | X |
| 12 | 0.2 | 0.3 | X | X |
| 13 | 0.5 | 1.0 | ○ | ○ |
| 14 | 1.0 | 2.1 | ○ | ○ |
| 15 | 2.0 | 2.9 | ○ | ○ |
| 16 | 3.0 | 4.8 | ○ | ○ |
| 17 | 5.0 | 8.6 | ○ | ○ |
| 18 | 7.0 | 10.9 | ○ | ○ |
| 19 | 10.0 | 14.3 | ○ | ○ |
| 20 | 15.0 | 19.2 | ○ | ○ |

Experimental Example 3

A Cu alloy thin film containing 7.0 atomic % of Ti was formed on an insulating film (TEOS film: SiOF film) formed on a silicon wafer surface of each sample by DC magnetron sputtering to have a thickness of 50 nm. Then, a pure Cu thin film was formed on the previously formed film by the DC magnetron sputtering to have a thickness of 700 nm. The sputtering was performed under the same condition as that of Experimental Example 1.

After this film forming step, the samples were subjected to a heating and pressing process. In the heating and pressing process, each sample was pressed at a pressure of 150 MPa under Ar gas atmosphere, heated from room temperature up to a temperature shown in the following Table 3 at a rate of temperature increase of 20° C. per minute, held at this temperature for 120 minutes, and then cooled up to the room temperature at a rate of temperature decrease of 20° C. per minute. Sample No. 21 shown in the following Table 3 is an example in which the sample was not subjected to the heating and pressing process after the previous film forming step.

The section of the sample with a laminated state of the films rendered viewable after the heating and pressing process was observed in the same way as that of the above-mentioned Experimental Example 1. As a result of observation, in the samples subjected to the heating and pressing process, it was found that a Ti oxide layer was formed as a Ti-rich layer between the insulating film and the Cu alloy thin film. The Ti oxide layer was considered to be a $TiO_2$ layer from a thermaldynamic point of view. The thickness of the Ti oxide layer of each sample was measured, and the results of measurement were shown in the following Table 3.

The Ti-rich layer was observed in the same way as that of the above-mentioned Experimental Example 1, and it was determined whether or not there was a broken part (defect) of the Ti-rich layer, whereby the completeness of the Ti oxide layer was evaluated. The results of this evaluation were shown in the following Table 3.

A part (interface) between the insulating film and the pure Cu thin film (or the Cu alloy thin film) of each sample was observed in the same way as that of the above-mentioned Experimental Example 1, and it was determined whether or not Cu is diffused into the insulating film. The results of this evaluation were shown in the following Table 3. Table 3 clearly shows that the heating and pressing process forms the Ti-rich layer. In particular, it is understood that by setting the heating temperature to 350° C. or more, the thickness of the Ti-rich layer can be increased drastically, and that the Ti-rich layer serves as a barrier layer for preventing diffusion of Cu into the insulating film.

TABLE 3

| No. | Process temperature (° C.) | Thickness of Ti oxide layer (nm) | Completeness of Ti oxide layer | Barrier properties |
|---|---|---|---|---|
| 21 | No process (20° C.) | — | — | X |
| 22 | 200 | 0.2 | X | X |
| 23 | 300 | 0.9 | X | X |
| 24 | 350 | 3.8 | ○ | ○ |
| 25 | 400 | 5.4 | ○ | ○ |
| 26 | 500 | 12.5 | ○ | ○ |
| 27 | 600 | 14.3 | ○ | ○ |
| 28 | 700 | 15.1 | ○ | ○ |

Experimental Example 4

Evaluation elements (TEG) were used which have an interconnection stripe pattern (stripe pattern) provided on an insulating film (TEOS film: SiOF film) formed on a silicon wafer surface, the pattern having the width of 0.13 μm (130 nm), the depth of 0.3 μm (300 nm), and the length of 2.0 mm. A Cu alloy thin film containing 7.0 atomic % of Ti was formed on the surface of each TEG by DC magnetron sputtering to have a thickness of 50 nm. Then, a pure Cu thin film was formed on the previously formed film by the DC magnetron sputtering to have a thickness of 700 nm, while covering a part of an interconnection pattern. The sputtering was performed under the same condition as that of Experimental Example 1.

After this film forming step, the samples were subjected to a heating and pressing process. In the heating and pressing process, each sample was pressed at a pressure of 150 MPa under Ar gas atmosphere, heated from room temperature up to a temperature shown in the following Table 4 at a rate of temperature increase of 20° C. per minute, held at this temperature for 120 minutes, and then cooled up to the room temperature at a rate of temperature decrease of 20° C. per minute. Sample No. 31 shown in the following Table 4 is an example in which the sample was not subjected to the heating and pressing process after the previous film forming step.

The TEG after the heating and pressing operation was processed by a focused ion beam device (FIB device) with the interconnection section exposed. The interconnection section of each sample was observed by a SIM image of the FIB device and an embedded state of the pure Cu into the interconnection pattern (embedding properties) was checked.

The embedding properties were evaluated by analyzing SIM images of sections of interconnection patterns, and calculating an embedding ratio by the following formula (1). Three interconnection patterns were observed, and the embedding ratio for each interconnection pattern was calculated. All individual embedding ratios were averaged to form the average embedding ratio for each sample, which was shown in the following Table 4.

$$\text{Embedding Ratio (\%)} = [(\text{Sectional Area of Pure Cu Embedded in Interconnection Pattern})/(\text{Sectional Area of Interconnection Pattern})] \times 100 \quad (1)$$

Table 4 clearly shows that when the heating and pressing process was performed at 350° C. or more, the pure Cu thin film formed by sputtering can be almost completely embedded into the interconnection pattern.

TABLE 4

| No. | Process temperature (° C.) | Embedding ratio (%) |
| --- | --- | --- |
| 31 | No process (20° C.) | 0 |
| 32 | 200 | 0 |
| 33 | 300 | 8.4 |
| 34 | 350 | 87.2 |
| 35 | 400 | 98.3 |
| 36 | 500 | 100.0 |
| 37 | 600 | 100.0 |
| 38 | 700 | 100.0 |

Experimental Example 5

Evaluation elements (TEG) were used which have an interconnection pattern (stripe pattern) provided on the insulating film (TEOS film: SiOF film) formed on a silicon wafer surface, the pattern having the width of 0.13 μm (130 nm), the depth of 0.3 μm (300 nm), and the length of 2.0 mm. A Cu alloy thin film containing 7.0 atomic % of Ti was formed on the surface of each TEG by DC magnetron sputtering to have a thickness of 50 nm. Then, a pure Cu thin film was formed on the previously formed film by electrolytic plating to have a thickness of 700 nm, while covering a part of the interconnection pattern. The sputtering was performed under the same condition as that of Experimental Example 1. The electrolytic plating was performed under the same condition as that of Experimental Example 2.

After this film forming step, the samples were subjected to a heating process. In the heating process, each sample was heated from room temperature up to a temperature shown in the following Table 5 at a rate of temperature increase of 20° C. per minute, held at this temperature for 120 minutes, and then cooled up to the room temperature at a rate of temperature decrease of 20° C. per minute. Sample No. 41 shown in the following Table 5 is an example in which the sample was not subjected to the heating and pressing process after the previous film forming step.

An embedded state (embedding properties) of the pure Cu into the interconnection groove on the TEG of the sample after the heating and pressing process was checked in the same way as that of Experimental Example 4. The embedding ratio of each sample was shown in the following Table 5.

Table 5 clearly shows that the pure Cu thin film formed by the electrolytic plating can be embedded into the interconnection pattern without being subjected to the heating process.

TABLE 5

| No. | Process temperature (° C.) | Embedding ratio (%) |
| --- | --- | --- |
| 41 | No process (20° C.) | 100.0 |
| 42 | 200 | 100.0 |
| 43 | 300 | 100.0 |
| 44 | 350 | 100.0 |
| 45 | 400 | 100.0 |
| 46 | 500 | 100.0 |
| 47 | 600 | 100.0 |
| 48 | 700 | 100.0 |

Experimental Example 6

In each of the following test specimens A and B, the Cu thin film formed was patterned by photolithography and wet etching to form a pattern for measurement of electrical resistivity. An interconnection resistance of the pattern of a length of 10 mm was measured by a four-probe method. The interconnection resistance (electrical resistivity) was first measured at room temperature. Then, the specimen was subjected to heat treatments for holding the specimen at predetermined temperatures (200° C., 300° C., 350° C., 400° C., 500° C., 600° C., 700° C.) at normal pressure under Ar atmosphere every two hours, and the interconnection resistance (electrical resistivity) was measured at each temperature.

[Test Specimen A]

A Cu alloy thin film containing 7.0 atomic % of Ti was formed on an insulating film (TEOS film: SiOF film) formed on a silicon wafer surface by DC magnetron sputtering to have a thickness of 50 nm. Then, a pure Cu thin film was formed on the previously formed film by the DC magnetron sputtering to have a thickness of 700 nm. The sputtering was performed under the same condition as that of Experimental Example 1.

[Test Specimen B]

A Cu alloy thin film containing 7.0 atomic % of Ti was formed on an insulating film (TEOS film: SiOF film) formed on a silicon wafer surface by DC magnetron sputtering to have a thickness of 50 nm. Then, a pure Cu thin film was formed on the previously formed film by the electrolytic plating to have a thickness of 700 nm. The sputtering was performed under the same condition as that of Experimental Example 1. The electrolytic plating was performed under the same condition as that of Experimental Example 2.

Relationships between heating temperatures and electrical resistivities of the above test specimens A and B are shown in FIG. 2. In FIG. 2, the result of the test specimen A was indicated by a circle colored in white, and the result of the test specimen B was indicated by a circle colored in black.

FIG. 2 clearly shows that the electrical resistance before heating is high, but the electrical resistance after heating is decreased. Either test specimen exhibits the minimum electrical resistance when heated at 500° C. At this time, the electrical resistivity was 1.91 μΩcm, which is an interconnection resistance that is low enough for LSI interconnections.

It should be understood by those skilled in the art that various modifications, combinations, sub-combinations, and alternations may occur depending on the design requirements and other factors insofar as they are within the scope and spirit of the appended claims or the equivalents thereof.

What is claimed is:

1. A method of fabricating semiconductor interconnections, the method comprising the steps of:

forming one or more grooves in an insulating film on a semiconductor substrate, the recess having a minimum width of 0.15 μm or less, and a ratio of a depth of the groove to the minimum width thereof (depth/minimum width) of 1 or more;

forming a Cu alloy thin film containing 0.5 to 10 atomic % of Ti in the groove of the insulated film along a shape of the groove in a thickness of 10 to 50 nm;

forming a pure Cu thin film in the groove with the Cu alloy thin film attached thereto; and annealing the substrate with the films at 350° C. or more to allow the Ti to be precipitated between the insulating film and the Cu alloy thin film.

2. The method according to claim 1, wherein said Cu alloy thin film is deposited by sputtering.

3. The method according to claim 1, wherein said pure Cu thin film is deposited by sputtering, and then pressed into the groove with the Cu alloy thin film attached thereto.

4. The method according to claim 3, wherein the pressing is performed at 50 MPa or more.

5. The method according to claim 1, wherein the annealing forms a layer comprising $TiO_2$ between the insulating film and the Cu alloy thin film.

6. The method according to claim 5, wherein the insulating film is directly adjacent to the Cu alloy thin film and the Cu alloy thin film is directly adjacent to the Cu thin film.

7. The method according to claim 1, wherein the annealing is carried out at a temperature of 500° C. or more.

8. The method according to claim 1, wherein copper from the Cu alloy film does not diffuse into the insulating film.

9. The method according to claim 1, wherein the annealing is carried out under an Ar atmosphere.

10. The method according to claim 1, wherein the Cu alloy thin film contains from 0.5 to 10 atomic % of Ti.

11. The method according to claim 1, wherein the Cu alloy film comprises from 0.2 to 15 atomic % of Ti.

12. The method according to claim 1, wherein after the annealing, the thickness of a layer comprising Ti is from 0.4 to 25.9 nm.

13. The method according to claim 1, wherein the annealing forms a discreet Ti rich layer between the insulating film and the Cu alloy thin film.

* * * * *